(12) United States Patent
Bakalski

(10) Patent No.: US 10,347,623 B2
(45) Date of Patent: Jul. 9, 2019

(54) SWITCH HAVING FIRST AND SECOND SWITCHING ELEMENTS CONNECTED IN PARALLEL WITH ONE ANOTHER

(71) Applicant: Infineon Technologies AG, Neubiberg (DE)

(72) Inventor: Winfried Bakalski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 3 days.

(21) Appl. No.: 15/584,467

(22) Filed: May 2, 2017

(65) Prior Publication Data

US 2017/0323881 A1 Nov. 9, 2017

(30) Foreign Application Priority Data

May 3, 2016 (DE) .................. 10 2016 108 231

(51) Int. Cl.
*H03K 17/687* (2006.01)
*H01L 27/02* (2006.01)
*H01L 29/417* (2006.01)
*H03K 17/10* (2006.01)
*H03K 17/284* (2006.01)
*H03K 17/12* (2006.01)
*H03K 17/041* (2006.01)
*H03K 17/16* (2006.01)

(52) U.S. Cl.
CPC ...... *H01L 27/0288* (2013.01); *H01L 27/0285* (2013.01); *H01L 29/41725* (2013.01); *H03K 17/102* (2013.01); *H03K 17/122* (2013.01); *H03K 17/284* (2013.01); *H03K 17/04106* (2013.01); *H03K 17/164* (2013.01); *H03K 17/6874* (2013.01); *H03K 2217/0009* (2013.01)

(58) Field of Classification Search
CPC ............. H01L 27/0288; H01L 27/0285; H01L 29/41725; H03K 17/102; H03K 17/284; H03K 17/04106; H03K 17/164; H03K 17/6874
USPC .......................................... 327/436
See application file for complete search history.

(56) References Cited

U.S. PATENT DOCUMENTS

| 4,317,055 A | 2/1982 | Yoshida et al. |
| 8,008,988 B1 * | 8/2011 | Yang .................... H03K 17/693 333/101 |
| 8,461,903 B1 | 6/2013 | Granger-Jones |
| 8,638,159 B2 * | 1/2014 | Ranta ..................... H03J 3/20 327/308 |
| 9,755,615 B2 * | 9/2017 | Ranta .................... H03H 7/0153 |
| 2008/0076371 A1 * | 3/2008 | Dribinsky ............ H03K 17/102 455/208 |
| 2013/0009725 A1 | 1/2013 | Heaney et al. |

(Continued)

OTHER PUBLICATIONS

Shifrin, Mitchell B. et al., "Monolithic FET Structures for High-Power Control Component Applications", IEEE Transactions on Microwave Theory and Techniques, vol. 37, No. 12, Dec. 1989, pp. 2134-2141.

*Primary Examiner* — Ryan Jager
(74) *Attorney, Agent, or Firm* — Murphy, Bilak & Homiller, PLLC

(57) ABSTRACT

A switch includes an input terminal and an output terminal. The switch also includes a first stack having transistors coupled in series, and a second stack having transistors coupled in series. The first stack and the second stack are connected in parallel with one another.

16 Claims, 3 Drawing Sheets

(56) References Cited

U.S. PATENT DOCUMENTS

| | | |
|---|---|---|
| 2013/0288617 A1 | 10/2013 | Kim et al. |
| 2014/0118053 A1 | 5/2014 | Matsuno |
| 2016/0020815 A1 | 1/2016 | Lee |
| 2018/0091135 A1* | 3/2018 | Wang .................. H03K 17/161 |
| 2018/0091136 A1* | 3/2018 | Wang .................. H03K 17/161 |

* cited by examiner

SWITCH HAVING FIRST AND SECOND SWITCHING ELEMENTS CONNECTED IN PARALLEL WITH ONE ANOTHER

TECHNICAL FIELD

Various embodiments relate to a switch comprising a first stack comprising transistors coupled in series and a second stack comprising transistors coupled in series. Various embodiments relate to a switch comprising a first switching element and a second switching element, wherein the switching of the first switching element is associated with a first time constant and the switching of the second switching element is associated with a second time constant, which is different from the first time constant.

BACKGROUND

Radio-frequency (RF) switches are used in a multiplicity of RE circuits in order to implement different functions. Resonant circuits can be set for resonance operation for example by means of an RF switch. Such resonant circuits can be used for example as antennas in mobile communication devices.

In detail, for example, a communication system that uses different frequencies for different signalling methods can be implemented using a network of RF switches. The RF switches can be used to select between different types of RF front-end circuits. One example of such a communication system is a multi-standard mobile telephone that can carry out telephone calls using different standards, such as, for example, Third Generation Partnership Project (3GPP) Code Division Multiple Access (CDMA) or 3GPP Global System for Mobile Communications (GSM) or 3GPP Long Term Evolution (LTE). One and the same communication standard, moreover, can use different frequencies e.g. depending on the network operator. Using an RF switch, an RF front-end circuit optimized for CDMA communication can be used for CDMA telephone calls; while an RF front-end circuit optimized for GSM communication can be used for GSM telephone calls.

Furthermore, RF switches can be used to implement settable matching networks for antennas or power amplifiers. In this way it is possible to provide settable adjustment of RF filters by connection and disconnection and/or bypassing of passive matching and setting elements.

In order to provide RF switches having a particularly high dielectric strength, techniques are known which use a stack comprising field effect transistors (FETs) coupled in series. Typical dielectric strengths are e.g. in the region of 24 V for 50-ohm mobile radio applications and up to 100 V on antenna resonant circuits for an open state of the switch. Since the components of typical production techniques such as, for example, the complementary metal oxide semiconductor (CMOS) process are not designed for such high voltages, a stacked arrangement of a multiplicity of FETs is used. The voltage can then be distributed among the multiplicity of FETs, such that each individual FEET is exposed only to a lower voltage. By way of example, individual FETs in a CMOS silicon-on-insulator (SOI) process have a maximum dielectric strength between source contact and drain contact of 2.5 V. 40 FETs, for example, are then stacked in order to obtain the dielectric strength of 100 V; see U.S. Pat. No. 4,317,055, for example.

However, such RF switches have certain disadvantages and/or limitations. By way of example, it may be possible that a lower limiting frequency for the voltage change at the input terminal exists for a specific dimensioning of the components used; see Shifrin, Mitchell B., Peter J. Katzin, and Yalcin Ayasli. "Monolithic FET structures for high-power control component applications." IEEE Trans. Microwave Theory and Techniques, 37 (1989) 2134-2141; equations 12, 14 and 15. If the voltage at the input terminal varies with a frequency that is lower than said limiting frequency, damage to the FETs used can occur. The switch can thus become unusable.

A slow variation of the voltages can often occur in association with electrostatic discharge (ESD).

U.S. Pat. No. 8,461,903 B1 discloses techniques in which comparatively fast switchover times can be achieved despite a conservative dimensioning of the components used—and thus an improved robustness vis à vis ESD events. However, a corresponding switch can be comparatively complicated and costly in terms of production. Moreover, a corresponding switch typically requires a PMOS transistor; however, a corresponding transistor is not available in various production techniques, with the result that such techniques cannot be usable or can be usable only to a limited extent.

SUMMARY

Therefore, there is a need for improved switches. In particular, there is a need for switches which do not have at least some of the limitations mentioned above, or have them only to a reduced extent.

In one example, a switch comprises an input terminal and at least one output terminal. The switch also comprises a first stack. The first stack comprises transistors coupled in series. The first stack is coupled between the input terminal and the at least one output terminal. The switch also comprises a second stack. The second stack comprises transistors coupled in series. The second stack is coupled between the input terminal and the at least one output terminal. The first stack and the second stack are connected in parallel with one another.

In a further example, a switch comprises an input terminal and at least one output terminal. The switch comprises a first switching element. The first switching element is coupled between the input terminal and the at least one output terminal. The switch also comprises a second switching element. The second switching element is coupled between the input terminal and the at least one output terminal. The first switching element and the second switching element are connected in parallel with one another. The switching of the first switching element is associated with a first time constant. The switching of the second switching element is associated with a second time constant. The second time constant is greater than the first time constant.

The features set out above and features described below can be used not only in the corresponding combinations explicitly set out, but also in further combinations or in isolation, without departing from the scope of protection of the present invention.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
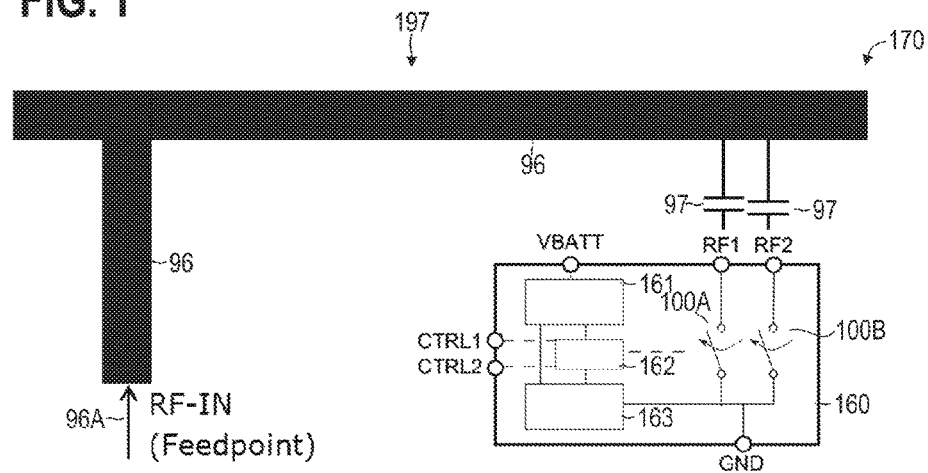
FIG. 1 illustrates two RF switches which are used in interaction with an LC resonant circuit in the form of an antenna tuning.

The above-described properties, features and advantages of this invention and the way in which they are achieved will become clearer and more clearly understood in association with the following description of the exemplary embodiments which are explained in greater detail in association with the drawings.

The present invention is explained in greater detail below on the basis of preferred embodiments with reference to the drawings. In the figures, identical reference signs designate identical or similar elements. The figures are schematic representations of various embodiments of the invention. Elements illustrated in the figures are not necessarily illustrated in a manner true to scale. Rather, the various elements illustrated in the figures are rendered in such a way that their function and general purpose becomes understandable to the person skilled in the art. Connections and couplings between functional units and elements as illustrated in the figures can also be implemented as indirect connection or coupling. A connection or coupling can be implemented in a wired or wireless manner. Functional units can be implemented as hardware, software or a combination of hardware and software.

A description is given below of techniques for implementing an electronic switch. The switch can switch electrical current flow and/or voltage. In particular, a description is given of techniques for implementing an RF switch suitable for switching a radio-frequency voltage. In this case, RF may denote for example such frequencies that are greater than 800 MHz, or are >1 GHz or are >2 GHz.

A description is given below of techniques for implementing an RF switch which is particularly robust vis à vis ESD events.

Typically, such states in which a low-frequency voltage having a significant amplitude is present on account of a discharge, for example, can be designated as ESD event. By way of example, an ESD event can be caused on account of the manual handling of a corresponding RF switch. ESD events can have e.g. frequencies in the range of a few MHz, i.e. significantly lower frequencies than RF. ESD events can be described by a wide variety of models. One example of a corresponding model is the so-called human body model (HBM).

In various examples, an RF switch comprises two or more switching elements; the various switching elements are connected in parallel with one another and have different time constants.

The time constants can be defined e.g. in a unit of time, for example seconds. In this case, larger (smaller) time constants can correspond to longer (shorter) times required for the switching.

In this case, the first time constant of a first switching element is adapted to fast switching and has e.g. a value of less than 50 µs, preferably less than 15 µs, further preferably less than 2 µs. The second time constant of a second switching element is different from the first time constant and is adapted to the ESD event. By way of example, the second time constant can have a value of greater than 50 µs, preferably greater than 150 µs, further preferably greater than 500 µs. The second time constant can thus be greater than the first time constant e.g. by a factor of five, preferably by a factor of ten, further preferably by a factor of 20.

The various switching elements can be implemented for example in each case by a stack comprising transistors coupled in series (series connection). In this case, transistors of the different stacks can be associated with different time constants.

Reference is primarily made below to examples in which the transistors are implemented by FETs. Examples of FETs are e.g.: metal-oxide-semiconductor FETs (MOSFETs); junction field effect transistor (JFET); high-electron-mobility transistor (HEMT); Schottky field effect transistor or metal-semiconductor field effect transistor (MESFET); insulated gate field effect transistor (IGFET); metal-insulator-semiconductor field effect transistor (MISFET); organic field effect transistors (OFET); and chemically sensitive field effect transistors (ChemFET). In other examples, however, the transistors can also be implemented e.g. by bipolar transistors or other solid-state switching elements.

It would then be possible, for example, for the different time constants to be implemented by suitable dimensioning of gate contact resistors of the FETs. Alternatively or additionally, it would also be possible for the different time constants to be implemented by suitable dimensioning of the gate widths of the FETs. Alternatively or additionally, it would also be possible for the different time constants to be implemented by suitable dimensioning of the distance between the source contact and the drain contact (gate length) of the different FETs. In some examples, however, the gate length and/or the gate width for all the FETs may be equal to a specific value and not vary significantly, e.g. have a variation of not greater than 20%, preferably not greater than 10%, further preferably not greater than 5%. In such a case, the time constant can be set by way of the dimensioning of the gate contact resistors.

By way of example, the time constants of the FETs of a first stack of the RF switch can be dimensioned in such a way that fast switching can be achieved. By contrast, the time constants of the FETs of a second stack of the RF switch can be dimensioned in such a way that the latter is tuned to a frequency of an ESD event and an ESD protection functionality is thereby implemented in relation to the first stack.

By virtue of the fact that the FETs of the second stack are tuned in relation to frequencies of an ESD event, it is possible to achieve a dissipation of the electrical charge associated with the ESD event via the FETs of the second stack. This makes it possible to prevent particularly high voltages from being present at the FETs of the first stack. Damage to the FETs of the first stack can be avoided as a result. This enables the ESD protection functionality.

At the same time, the proper operation of the switch—for example with regard to fast switching by means of the first stack of FETs—cannot be impaired, or cannot be significantly impaired, by the presence of the second stack of FETs. In this case, by way of example, in the event of fast switching by means of the first stack of FETs, the second stack of FETs can be manifested merely as a further capacitance, but without significantly reducing the performance of the RF switch overall.

FIG. 1 shows a system 170, comprising two RF switches 100A, 100B. Each of the RF switches 100A, 100B can be embodied in accordance with the techniques described herein.

The system 170 comprises a metal conductor 96, which can be embodied as inductance for an LC resonant circuit 197. An RF signal 96A is fed into the metal conductor 96. The metal conductor 96 is coupled to ground in each case via two differently dimensioned capacitors 97 and associated switches 100A, 100B. The metal conductor 96 and the capacitors 97 form the LC resonant circuit 197. The LC resonant circuit 197 can implement an antenna, for example; in this case, the antenna acts as a resonance reservoir.

In this case, the switches 100A, 100B can be operated in a closed state or an open state. In the open state, a low conductivity is present (non-conducting state); in the closed state, a high conductivity is present (conducting state). Depending on the state in which the switches 100A, 100B are operated, a different capacitor 97 interacts with the conductor track 96; in this way, resonant operation of the LC resonant circuit can be achieved for different frequencies. The resonant operation enables a high transmission power and energy-efficient operation.

In this case, the switches 100A, 100B are part of an electrical circuit 160 that also comprises a charge pump 163, a driver 162 and a voltage regulator 161. The driver 162 is used to operate the switches 100A, 100B in each case optionally in the conducting or non-conducting state. The charge pump 163 provides the charge for the switching. The charge pump 163 can optionally also apply negative voltage to the substrate. The voltage regulator 161 controls the components 162, 163.

Figure 2:
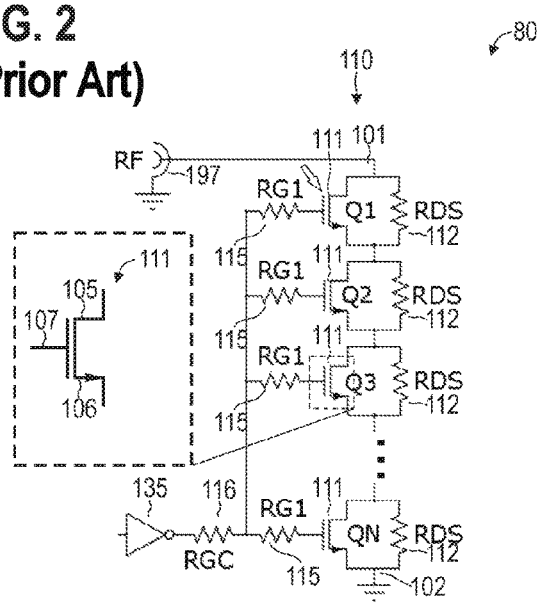
FIG. 2 schematically illustrates the construction of an RF switch in accordance with reference implementations.

FIG. 2 illustrates an RF switch 80 in accordance with a reference implementation. The RF switch 80 comprises a stack 110 comprising a plurality of FETs 111. The FETs 111—for example N-channel FETs—are connected in series; the RF switch 80 thus comprises a series connection of the FETs 111. In this case, a respective source contact 106 is coupled to the drain contact 105 of the respectively adjacent FET 111; the state of the FET 111 is controlled via the gate contact 107 (cf. inset in FIG. 2; the inset is enclosed by a dashed border in FIG. 2).

The 101 resonant circuit 197 is connected to the input terminal 101. Ground is connected to the output terminal 102.

Resistors 112 are provided between the drain contacts 105 and the source contacts 106. The resistors 112 have high resistances, i.e. have for example resistance values in the range of 20-40 kohms. The resistors 112 prevent undefined floating of the potentials of the source contacts 106 and drain contacts 105 of the various FETs 111 in the non-conducting state.

A driver 135 is coupled to the gate contacts of the various FETs 111 via gate contact resistors 115, 116. The gate contact resistors 115, 116 and the gate capacitances of the gate contacts 107 define the time constant of the respective FET 111:

$$\tau = RC, \quad (1)$$

wherein R defines the value of the respective gate contact resistor 115, 116; and C defines the value of the respective gate capacitance. The gate capacitance is typically proportional to the gate width. A further influencing factor may be the gate length. Typical gate widths for a FET may be e.g. in the range of 4-6 mm, wherein e.g. 4 sets each of 100 FET fingers are used here per FET, wherein each finger in turn has a gate width of 15 μm. Typical gate lengths for a FET may be e.g. in the range of 10-500 nm, e.g. in the range of 100-120 nm.

In principle, faster switchover, i.e. a smaller time constant or a time constant corresponding to a shorter time, is worthwhile here. On the other hand, a faulty behaviour or damage of one or more of the FETs 111 may occur in association with comparatively small time constants for slow ESD events. In particular, a non-uniform distribution of the voltage via the various FETs 111 may occur in this case. This is explained below.

If a slow voltage pulse—i.e. with a frequency spectrum significantly below RF—is present at the input terminal 101: as a result of a parasitic capacitive coupling between the drain contact 105 and the gate contact 107 of the FET 111 adjacent to the input terminal 101 (said FET being illustrated at the very top and highlighted by the arrow in FIG. 2), this topmost FET 111 is opened; however, on account of the comparatively small time constant, the charge flows away from the gate contact 107 rapidly via the gate contact resistor 115, 116 and said FET 111 closes again. As a result, a particularly high voltage is present between the drain contact 105 and the source contact 106 of the topmost FET 111; this voltage can be greater than the breakdown voltage that can be present between drain contact 105 and source contact 106. The FET 111 can be damaged as a result.

For a quantitative explanation of this effect, see the abovementioned publication by Shifrin, Mitchell B. et al.: equ. 15.

Such a dimensioning of the gate contact resistors 115, 116 brings about a limitation with regard to the achievable switching times. A description is given below of how an effective ESD protection can be achieved despite a small dimensioning of the time constants for the FETs 111.

Figure 3:
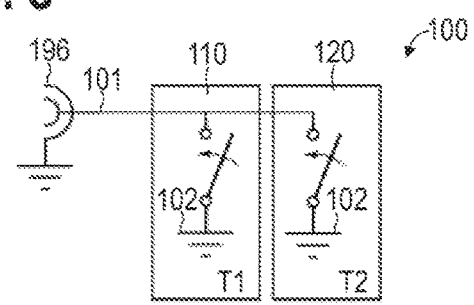
FIG. 3 schematically illustrates the construction of an RF switch in accordance with various embodiments.

FIG. 3 illustrates aspects with regard to an RF switch 100. The RF switch 100 comprises two switching elements 110, 120. Each of the switching elements 110, 120 is connected to the input terminal 101; a corresponding output terminal 102 of the switching elements 110, 120 is connected to ground. The input terminal 101 is connected to the IC resonant circuit 196. In various examples, it may be possible for the switching element 120 to be operated in the non-conducting state permanently or in normal operation—and to be operated in the conducting state e.g. only when an ESD event is present.

In the example in FIG. 3, the switching elements 110, 120 are coupled in parallel with one another between the input terminal 101 and the output terminal 102. The switching element 110 is associated with a first time constant (designated as T1 in FIG. 3); the switching element 120 is associated with a second time constant (designated as T2 in FIG. 3). The first time constant has a smaller value than the second time constant. This means that the switching element 110 can switch faster than the switching element 120.

The following effect can be achieved as a result. When a low-frequency voltage is present at the input terminal 101, the switching element 120 is actuated and remains in the conducting state for a comparatively long time on account of the large time constant T2. As a result, the charge associated with the low-frequency voltage can flow away to ground via the switching element 120. The switching element 110 is thereby protected. Fast switching—e.g. in normal operation—can be achieved by the switching element 110.

Figure 4:
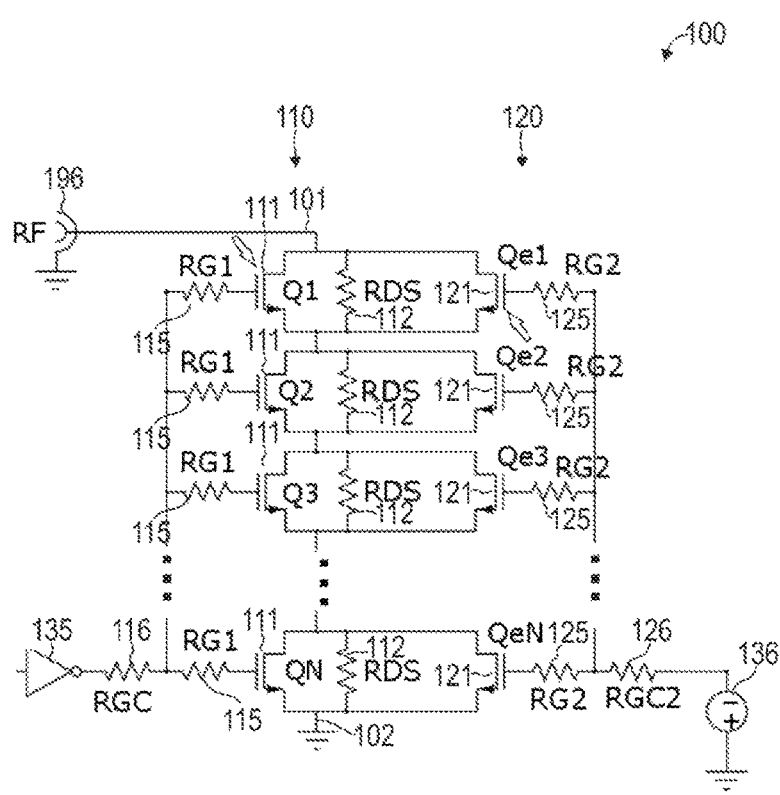
FIG. 4 schematically illustrates the construction of an RF switch in accordance with various embodiments.

FIG. 4 illustrates aspects with regard to a switch 100. In particular, FIG. 4 illustrates one possible implementation of the switch 100 from FIG. 3. The switching element 110 is implemented as a stack comprising FETs 111 coupled in series. Correspondingly, the switching element 120 is implemented as a stack of FETs 121—for example N-channel FETs—coupled in series. The first stack 110 and the second stack 120 are in turn connected in parallel with one another and between the input terminal 101 and the output terminal 102.

In the example in FIG. 4 the gate contacts 107 of the FETs 111 of the stack 110 have respectively associated resistors 115, 116 (gate contact resistors), all of which are dimensioned identically (in the example in FIG. 4: R=RG1+RGC). Correspondingly, in the example in FIG. 4, the FETs 121 of the stack 120 each have gate contact resistors 125, 126, all of which are dimensioned identically (in the example in FIG. 4: R=RG2+RGC2). The resistors may be implemented e.g. as poly resistors or diffusion resistors. By way of example, a lateral dimension of the poly resistor then determines the resistance value. A particularly simple layout of the switch 100 can be produced by means of identical dimensioning of the resistance values. The layout can be particularly space-saving.

In this case, the driver 135 is coupled to the FETs 111 of the stack 110 via the gate contact resistors 115, 116 (in accordance with the example in FIG. 2). The driver 135 implements a control terminal. The control terminal can be used for controlling the state of the FETs 111 of the stack 110. By way of example, a control signal can be received for this purpose; the control signal can e.g. be time-dependent and thus have the effect that the FETs 111 are operated in the non-conducting or conducting state for different times. The driver 135 thus has the effect that the FETs 111 of the stack 110 are operated in the conducting or non-conducting state depending on a control signal.

In this case, however, the driver 135 is not configured also to switch the FETs 121 or to operate them in the conducting state or non-conducting state depending on the control signal. The driver 135 is not directly connected to the gate contacts 107 of the FETs 121.

Instead, a voltage source 136 is provided for controlling the FETs 121. The voltage source 136 is coupled to the FETs 121 of the stack 120 via the gate contact resistors 125, 126. The voltage source 136 is configured to generate a bias voltage signal (called bias signal). The voltage source is configured to operate the FETs 121 of the stack 120 in the non-conducting state by means of the bias voltage signal. In this case, the voltage source 136 can be configured to operate the FETs 121 permanently in the non-conducting state. This means that the voltage source 136 cannot be configured to operate the FETs 121 in the conducting state. The bias voltage signal can be dimensioned accordingly. The bias voltage signal may have no time dependence, i.e. may assume the corresponding value in a constant manner during the operation of the switch 100.

However, the voltage source 136 is not configured to operate, i.e. to switch, the FETs 111 of the stack 110 in the conducting or non-conducting state by means of the bias voltage signal. The voltage source 136 is not directly connected to the gate contacts 107 of the FETs 111.

In the example in FIG. 4, the various FETs 111, 121 all have the same gate width (not evident from FIG. 4). By way of example, it would be possible for a variation of the gate widths between the FETs 111 of the stack 110 to be not greater than 20%, preferably not greater than 10%, further preferably not greater than 5%. By way of example, it would be possible for a variation of the gate widths between the FETs 121 of the stack 120 to be not greater than 20%, preferably not greater than 10%, further preferably not greater than 5%. In this case, the variation may correspond e.g. to a scatter measure, for example a standard deviation, etc. It is thus possible for the gate widths of the FETs 111 and/or the gate widths of the FETs 121 to be approximately identical in each case. A particularly simple layout of the switch 100 can be produced by means of identical dimensioning of the gate widths. In particular, a high degree of integration and a good area utilization can be achieved.

Corresponding criteria can also be satisfied for the variation of the gate lengths.

It was described above that the gate widths of the FETs 111 and/or the gate widths of the FETs 121 can be of approximately the same length. It is optionally also possible for the gate widths of the FETs 111 to be approximately identical to the gate widths of the FETs 121. By way of example, a difference between the average gate width of the FETs 111 and the average gate width of the FETs 121 could be not greater than 20%, preferably not greater than 10%, further preferably not greater than 5%—e.g. relative to the average gate width of the FETs 111 or the average gate width of the FETs 121. A particularly simple layout of the switch 100 can be produced by means of identical dimensioning of the gate widths. In particular, a high degree of integration and a good area utilization can be achieved.

Corresponding criteria can also be satisfied for the differences between the gate lengths.

In this case, the gate contact resistors 115, 116 of the stack 110 and the gate contact resistors 125, 126 of the stack 120 are dimensioned in such a way that the switching of the FETs 111 of the stack 110 is associated with first time constants and the switching of the FETs 121 of the stack 120 is associated with second time constants, which are greater than the first time constants. The ESD protection functionality can be achieved by means of the different dimensioning of the time constants for the FETs 111 and the FETs 121.

This functioning or the ESD protection functionality is explained below. If a slow voltage pulse—i.e. with a frequency spectrum significantly below RF—is present at the input terminal 101: as a result of a parasitic capacitive coupling between the drain contact 105 and the gate contact 107 of the FET 111 of the stack 110 that is adjacent to the input terminal 101 (said FET being illustrated at the very top in FIG. 4; highlighted by the arrow in FIG. 4), this topmost FET 111 is opened; however, on account of the comparatively small time constant, the charge flows away from the gate contact 107 rapidly via the gate contact resistor 115, 116 and said FET 111 closes again. As a result of a parasitic capacitive coupling between the drain contact 105 and the gate contact 107 of the FET 121 of the stack 120 that is adjacent to the input terminal 101 (said FET being illustrated at the very top in FIG. 4; highlighted by the arrow in FIG. 4), at the same time this topmost FET 121 is opened; however, on account of the comparatively large time constant, the charge flows away from the gate contact 107 only slowly via the gate contact resistor 125, 126 and this FET 121 remains conducting. This prevents a large voltage from being present between drain contact 105 and source contact 106 of the topmost FET 111 of the stack 110. Therefore, what can thus be achieved is that the FET 111 of the stack 110 that is arranged adjacent to the input terminal 101 is configured to be in the conducting state for a first time duration in the event of a signal change at the input terminal 101 which has a third time constant greater than the first time constant thereof; while the FET 121 of the stack 120 that is arranged adjacent to the input terminal 101 is configured to be in the conducting state for a second time duration in the event, of the signal change at the input terminal 101 that has the third time constant, wherein the second time duration is longer than the first time duration. In this case, the second time duration may correspond to the second time constant; the first time duration may correspond to the first time constant.

In this context, it is possible for the time constants of the FETs 121 of the stack 120 to be tuned to the typical frequencies of ESD events. By way of example, it would be possible for the time constants of the FETs 121 of the stack 120 to have values of greater than 50 µs, preferably of greater than 150 µs, further preferably of greater than 500 µs. Such values of the time constants correlate well with typical frequencies of ESD events that are expected for example in the context of the HBM. Good ESD protection functionality can then be ensured because at least some FETs 121 of the stack 120 remain conducting as long as the ESD voltage pulse is persistent.

In this case, it would be possible, for example, for the time constants of the FETs 111 of the stack 110 to be tuned to typical switchover times between different frequencies—for example with regard to a communication application. Typically, for example in connection with an inter-radio access technology handover, a particularly short switchover time may be worthwhile in order to avoid an interruption of the data connection. By way of example, it would be possible for the time constants of the FETs 111 of the stack 110 to assume values of less than 50 µs, preferably less than 15 µs, further preferably less than 2 µs.

It is thus possible for the smallest value of the time constants of the FETs 121 of the stack 120 to be greater than the largest value of the time constants of the FETs 111 of the stack 110 at least by a factor of five, preferably by at least a factor of ten, further preferably by at least a factor of 20.

In the example in FIG. 4, in each case four FETs 111, 121 are illustrated by way of example for the stack 110 and the stack 120. The total number of FETs 111, 121 can vary depending on the application. By way of example, the stack 110 can comprise more than 20, preferably more than 40, further preferably more than 55, FETs 111. By way of example, the stack 120 can comprise more than 20, preferably more than 40, further preferably more than 55, FETs 121.

In various examples, it would be possible for the stacks 110, 120 to comprise the same number of FETs 111, 121. This is the case in particular for examples in which—as is the case in the scenario in FIG. 4—the second stack 120 comprises an associated FET 121 for each FET 111 of the stack 110, wherein the source contact 106 of each FET 121 of the stack 120 is coupled to the source contact 106 of the respectively associated FET 111 of the stack 110, and wherein the drain contact 105 of each FET 121 of the stack 120 is coupled to the drain contact 105 of the respectively associated FET 111 of the stack 110. Such a 1:1 assignment between the FETs 111 of the stack 110 and the FETs 121 of the stack 120 can achieve a particularly good coupling between the stacks 110, 120. A particularly good ESD protection functionality can be achieved in this way. Moreover, in such a scenario it may be possible to achieve a particularly space-saving integration of the switch 100. By way of example, the resistors 112 can be used for both stacks 110, 120. Moreover, it is possible to use e.g. a single capacitor between a corresponding source contact 106 and drain contact 105 (not illustrated in FIG. 4) for both FETs 111, 121 associated to one another. It would also be possible for the corresponding FET 121 itself to be designed as an additional capacitance in relation to the associated FET 111.

Since the two gate contact resistors 115, 125 can also have different capacitive parasitics on account of a different geometry, a deviating voltage distribution can form without a coupling of the source contacts 106 and the drain contacts 125 in the case of the two FETs 111, 121, which distribution may be undesired on account of non-linearities. Furthermore, in the case of such a coupling of the source contacts 106 and the drain contacts 105, the FET 111 can also contribute to the ESD protection functionality; this means that the associated FETs 111, 121 can mutually support one another regarding the reduction of the ESD voltage pulse.

In other examples, however, it would also be possible for the stack 110 and the stack 120 to be implemented separately from one another and for a coupling to be present only in the region of the input terminal 101.

In the example an FIG. 4, the FETs 111 of the stack 110 all have the same first time constant; in the example in FIG. 4, the FETs 121 of the stack 120 also all have the same second time constant. In other examples, however, it would be possible for the different FETs 111 of the stack 110 to have different first time constants, for example depending on the respective dimensioning of the gate contact resistors 115, 116 and/or depending on the dimensioning of the gate widths. Correspondingly, it would also be possible for the different FETs 121 of the stack 120 to have different second time constants, for example depending on the respective dimensioning of the gate contact resistors 125, 126 and/or depending on the dimensioning of the gate widths. In the example in FIG. 4, in particular the gate contact resistors 115, 116 of the FETs 111 all have the same value; correspondingly, the gate contact resistors 125, 126 of the FETs 121 all have the same value. In other examples, however, it would also be possible for the gate contact resistors 115, 116 of the FETs 111 of the stack 110 and/or the gate contact resistors 125, 126 of the FETs 121 of the stack 120 to have different values in each case.

Figure 5:
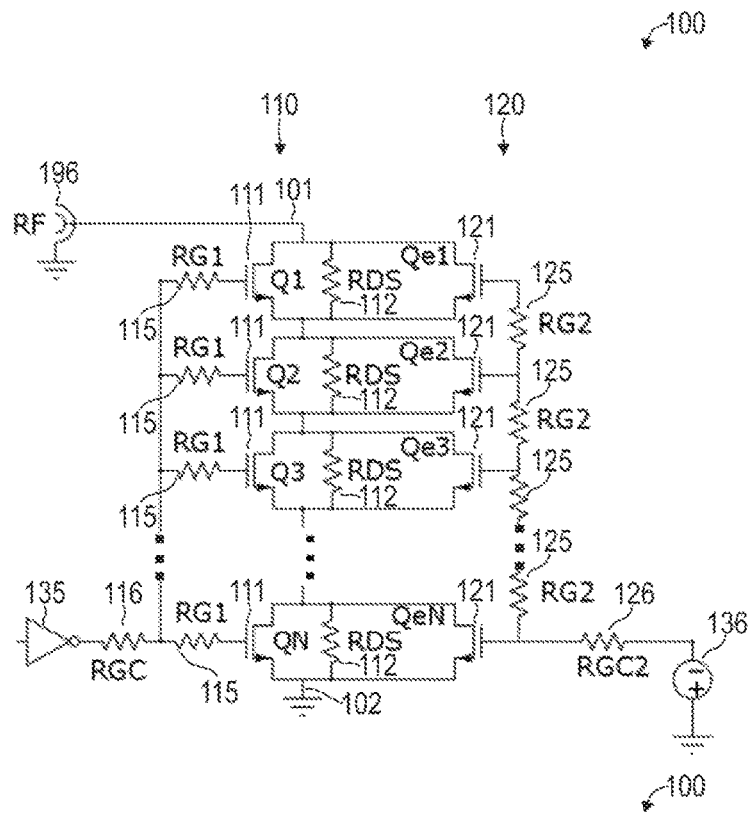
FIG. 5 schematically illustrates the construction of an RF switch in accordance with various embodiments.

FIG. 5 illustrates aspects with regard to an RF switch 100. The example in FIG. 5 corresponds in principle to the example in FIG. 4. However, in the example in FIG. 5, the FETs 121 of the stack 120 have different gate contact resistors 125, 126. This is achieved by a series connection of in each case identically dimensioned resistors 125. Such a connection is sometimes also referred to as totem pole geometry.

What is achieved as a result is that the different FETs 121 of the stack 120 have different time constants. In order to ensure a particularly effective ESD protection functionality, provision is made here for the FET 121 of the stack 120 that is adjacent to the input terminal 101 (said FET being illustrated at the top in FIG. 5) to have the largest resistance value of the gate contact resistors 125, 126. What can be achieved as a result is that this topmost FET 121 of the stack 120 has that time constant which corresponds to the longest time. A particularly good ESD protection functionality can be achieved as a result. In particular, it can be ensured that said topmost FET 121 of the stack 120 remains in the conducting state for a particularly long time duration if an ESD signal is present at the input terminal 101.

At the same time, the gate contact resistors 125, 126 of the FETs 121 of the stack 120 have resistance values decreasing continuously—on account of the series connection of the resistors 125—proceeding from the FET 121 adjacent to the input terminal 101 through to the FET 121 adjacent to the at least one output terminal 102. As a result, a particularly high value for the corresponding gate contact resistors 125, 126 can be achieved for the FETs 121 of the stack 120 that are arranged near the input terminal 101—without the individual resistors having to be given particularly large dimensions, which can save space. By way of example, the gate contact resistor 125, 126 of the FET 121 adjacent to the input terminal 101 could have a resistance value of greater than 100 kohms, preferably of greater than 500 kohms, further preferably of greater than 1000 kohms.

At the same time, however, it may be desirable for the individual resistors 125, 126 not to be dimensioned in an excessively small fashion. This makes it possible to prevent the contact resistance from making up a significant proportion of the total resistance value; on account of comparatively large variation or manufacturing tolerances for the contact resistances, an inaccuracy can be avoided in this way.

Figure 6:
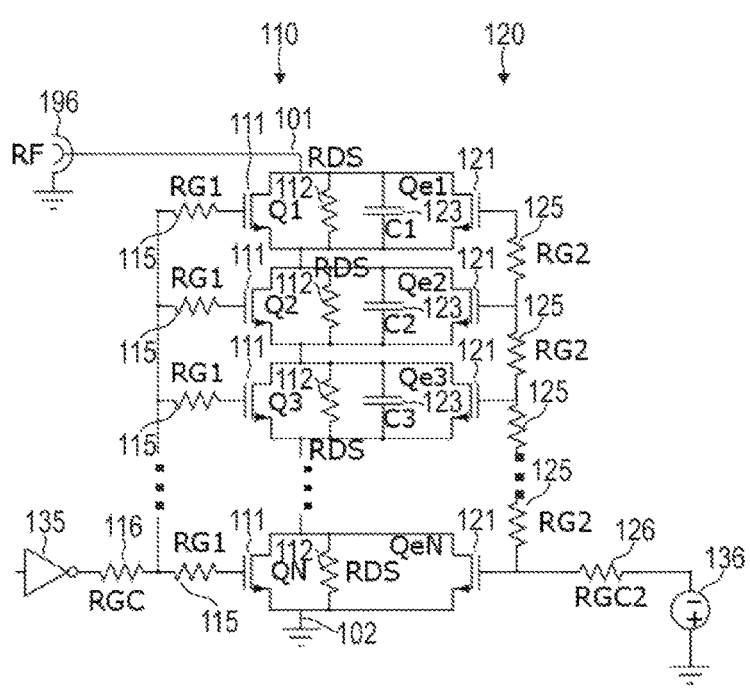
FIG. 6 schematically illustrates the construction of an RF switch in accordance with various embodiments.

FIG. 6 illustrates aspects with regard to an RF switch 100. The example in FIG. 6 corresponds in principle to the example in FIG. 5. However, in the example in FIG. 6, the FETs 121 of the stack 120 have additional capacitors 123 connected between the corresponding drain contacts 105 and source contacts 106.

These capacitors 123 bring about an additional capacitance between the drain contacts 105 and source contacts 106 of the FETs 121 of the stack 120; as a result, the voltage in the non-conducting state can be distributed particularly symmetrically along the gate length of the respective FET 121. Non-linearities during the operation of the switch 100 can be avoided as a result.

Specifically, for example, a capacitance of the substrate can bring about additional non-linearities of the switch 100. These non-linearities are typically reduced significantly by the use of an SOI process. In an SOI process, the substrate, for example silicon, is electrically isolated by an insulator layer from the integrated structures of the switch 100, in particular from the FETs 111, 121. In order to avoid an uncontrolled fluctuation (called floating) of the potential of the switch 100, it is possible for an additional body bias resistor to be provided per FET 111, 121, which fixes the FETs 111, 121 at a defined potential. It would alternatively or additionally also be possible to use a negative bias voltage for the substrate in order to switch off the substrate diodes and significantly reduce asymmetries as a result. In such cases, however, a significant parasitic contribution arises on account of the body bias resistor. This parasitic contribution can be compensated for by the capacitors 123.

To summarize, a description was given above of techniques for providing an efficient ESD protection functionality for RF switches. In this case, a further switching element having a particularly large associated time constant is connected in parallel with an established RF switching element. A stacked arrangement of FETs is preferably used for the switching elements.

Such techniques can be implemented in particular in association with an established CMOS process. More complicated technologies such as, for example, GaN-based structures or micromechanical elements (micromechanical structure; MEMS) need not be used. By way of example, in contrast to U.S. Pat. No. 8,461,903, no PMOS transistor is required. The required wiring outlay is limited; simple architectures are possible. By way of example, in contrast to U.S. Pat. No. 8,461,903, complicated synchronization of the gate contacts during switchover is not required; suppression of the RF voltage during switchover in order to avoid damage is not necessary either. The PMOS transistor in accordance with U.S. Pat. No. 8,461,903 does not have the same capacitance for the conducting and non-conducting states: As a result, the RF signal can bring about non-linearities since positive and negative half-cycles can experience different parasitic capacitances. Such disadvantages, too, can be avoided by means of the techniques described herein.

By using two different time constants, on the one hand, it is possible to provide fast switching (by means of the smaller time constant); on the other hand, it is possible to avoid overvoltages in association with ESD events (by means of the larger time constant).

On the other hand, the RF behaviour of the switch is significantly influenced only slightly by the provision of the additional switching element having the large time constant. Since, in various examples, the FETs of the second stack having the large time constants are operated by means of a corresponding bias voltage signal in the non-conducting state, merely an additional capacitance is brought about in relation to the first stack comprising the FETs having small time constants. Said additional capacitance proves to be all the lower, the more FETs the stacks have.

It goes without saying that the features of the above-described embodiments and aspects of the invention can be combined with one another. In particularly the features can be used not only in the combinations described, but also in other combinations or by themselves, without departing from the field of the invention.

A description was given above of various examples with regard to applications in which the switch is implemented in a system comprising an antenna that forms an LC resonant circuit. However, corresponding techniques can also be implemented for other applications such as e.g. a switching of matching at RF amplifiers (low noise amplifier, power amplifier) or surface acoustic wave (SAW) and/or bulk acoustic wave (BAW) filters.

A description was given above of various examples with regard to the dependence of the time constant on the gate width. In other examples, the time constant can alternatively or additionally also be set by variation of the gate length.

A description was given above of various examples with regard to FETs which form different switching elements in each case in a stacked arrangement. In other examples, bipolar transistors, for example, could also be used instead of FETs.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switch, comprising:
   an input terminal;
   an output terminal
   a first stack comprising transistors coupled in series, the first stack being coupled between the input terminal and the output terminal; and
   a second stack comprising transistors coupled in series, the second stack being coupled between the input terminal and the output terminal,
   wherein the first stack and the second stack are connected in parallel with one another,
   wherein the transistors of the first stack have first time constants,
   wherein the transistors of the second stack have second time constants, wherein at least some of the second time constants have larger values than the first time constants,
wherein the second time constants assume different values for different transistors of the second stack, and
wherein a time constant of a transistor of the second stack that is adjacent to the input terminal assumes the largest value of all the second time constants.

2. The switch of claim 1, wherein a smallest value of the second time constants is greater than a largest value of the first time constants at least by a factor of five.

3. The switch of claim 1,
wherein the first time constants have values of less than 50 µs, and/or
wherein the second time constants have values of greater than 50 µs.

4. The switch of claim 1,
wherein the second stack comprises, for each transistor of the first stack, an associated transistor,
wherein a source contact of each transistor of the second stack is coupled to a source contact of the respectively associated transistor of the first stack,
wherein a drain contact of each transistor of the second stack is coupled to a drain contact of the respectively associated transistor of the first stack.

5. The switch of claim 1, further comprising:
a control terminal configured to receive a control signal and which is coupled to gate contacts of the transistors of the first stack in order to operate the transistors of the first stack in a non-conducting state or a conducting state depending on the control signal.

6. The switch of claim 5, wherein the control terminal is not configured to operate the transistors of the second stack in the non-conducting state or in the conducting state depending on the control signal.

7. The switch of claim 1, further comprising:
a voltage source configured to generate a bias voltage signal and which is coupled to gate contacts of the transistors of the second stack, wherein the voltage source is configured to operate the transistors of the second stack in a non-conducting state by means of the bias voltage signal.

8. The switch of claim 7, wherein the voltage source is not configured to operate the transistors of the first stack in the non-conducting state or in the conducting state by means of the bias voltage signal.

9. The switch of claim 7,
wherein the voltage source is coupled to the gate contacts of the transistors of the second stack via gate contact resistors,
wherein the gate contact resistors have identical values for different field effect transistors of the second stack.

10. The switch of claim 7,
wherein the voltage source is coupled to the gate contacts of the transistors of the second stack via gate contact resistors,
wherein the gate contact resistors have different values for different transistors of the second stack.

11. The switch of claim 10, wherein the gate contact resistor of the transistor of the second stack that is adjacent to the input terminal has the largest value in comparison with the gate contact resistors of the transistors of the second stack that are not adjacent to the input terminal.

12. The switch of claim 10, wherein the gate contact resistors of the transistors of the second stack have values that decrease continuously beginning from the transistor adjacent to the input terminal through to the transistor adjacent to the output terminal.

13. The switch of claim 9, wherein at least the gate contact resistor of the transistor adjacent to the input terminal has a value of greater than 100 kohms.

14. The switch of claim 1,
wherein a variation of gate widths and/or of gate lengths of the transistors of the first stack is not greater than 20%,
wherein a variation of gate widths and/or of gate lengths of the transistors of the second stack is not greater than 20%.

15. A system, comprising:
a switch comprising an input terminal, an output terminal, a first stack comprising transistors coupled in series, the first stack being coupled between the input terminal and the output terminal, and a second stack comprising transistors coupled in series, the second stack being coupled between the input terminal and the output terminal, wherein the first stack and the second stack are connected in parallel with one another;
an LC resonant circuit coupled to the input terminal of the switch; and
a ground contact coupled to the output terminal of the switch,
wherein the transistors of the first stack have first time constants,
wherein the transistors of the second stack have second time constants,
wherein at least some of the second time constants have larger values than the first time constants,
wherein the second time constants assume different values for different transistors of the second stack, and
wherein a time constant of a transistor of the second stack that is adjacent to the input terminal assumes the largest value of all the second time constants.

16. A switch, comprising:
an input terminal;
an output terminal;
a first switching element coupled between the input terminal and the output terminal;
a second switching element coupled between the input terminal and the output terminal;
wherein the first switching element and the second switching element are connected in parallel with one another,
wherein the first switching element has a first time constant,
wherein the first switching element has with a second time constant,
wherein the first and second time constants are time measurements of how fast the transistors can be switched,
wherein the second time constant is greater than the first time constant,
wherein the first switching element comprises a first stack comprising transistors coupled in series,
wherein the second switching element comprises a second stack comprising transistors coupled in series,
wherein the transistors of the first stack have first time constants,
wherein the transistors of the second stack have second time constants,
wherein at least some of the second time constants have larger values than the first time constants,
wherein the second time constants assume different values for different transistors of the second stack, and wherein a time constant of a transistor of the second stack that is adjacent to the input terminal assumes the largest value of all the second time constants.

* * * * *